(12) United States Patent
Sato et al.

(10) Patent No.: US 10,119,200 B2
(45) Date of Patent: Nov. 6, 2018

(54) SILICON CARBIDE SINGLE CRYSTAL SUBSTRATE AND PROCESS FOR PRODUCING SAME

(71) Applicant: SHOWA DENKO K.K., Tokyo (JP)

(72) Inventors: Shinya Sato, Tokyo (JP); Tatsuo Fujimoto, Tokyo (JP); Hiroshi Tsuge, Tokyo (JP); Masakazu Katsuno, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 434 days.

(21) Appl. No.: 14/441,001

(22) PCT Filed: Nov. 15, 2013

(86) PCT No.: PCT/JP2013/080935
§ 371 (c)(1),
(2) Date: May 6, 2015

(87) PCT Pub. No.: WO2014/077368
PCT Pub. Date: May 22, 2014

(65) Prior Publication Data
US 2015/0267319 A1    Sep. 24, 2015

(30) Foreign Application Priority Data

Nov. 15, 2012 (JP) .................. 2012-251038

(51) Int. Cl.
*C30B 23/00* (2006.01)
*C30B 23/02* (2006.01)
*C30B 29/36* (2006.01)

(52) U.S. Cl.
CPC ............ *C30B 23/02* (2013.01); *C30B 23/002* (2013.01); *C30B 23/025* (2013.01); *C30B 29/36* (2013.01)

(58) Field of Classification Search
None
See application file for complete search history.

(56) References Cited

U.S. PATENT DOCUMENTS

2005/0211156 A1    9/2005  Gunjishima et al.
2012/0060751 A1    3/2012  Urakami et al.
2014/0363607 A1   12/2014  Sato et al.

FOREIGN PATENT DOCUMENTS

CN    103620095 A    3/2014
EP    2 752 508 A1   7/2014
(Continued)

OTHER PUBLICATIONS

Chinese Office Action, dated Nov. 3, 2016, for counterpart Chinese Application No. 201380052882.X, along with an English machine translation.

(Continued)

*Primary Examiner* — Guinever S Gregorio
(74) *Attorney, Agent, or Firm* — Birch, Stewart, Kolasch & Birch, LLP

(57) ABSTRACT

Provided are: a silicon carbide single crystal substrate which is cut out from a silicon carbide bulk single crystal grown by the Physical Vapor Transport method; and a process for producing the same. The number of screw dislocations in one of the semicircle areas of the substrate is smaller than that in the other thereof, namely, the number of screw dislocations in a given area of the substrate is reduced. The semicircle areas of the substrate correspond respectively to the halves of the substrate. The present invention pertains to: a silicon carbide single crystal substrate which is cut out from a silicon carbide bulk single crystal grown by the Physical Vapor Transport method and which is characterized in that the average value of the screw-dislocation densities observed at multiple measurement points in one of the semicircle areas, which correspond respectively to the (Continued)

halves of the substrate, is 80% or less of the average value of screw-dislocation densities observed at multiple measurement points in the other of the semicircle areas; and a process for producing the same.

4 Claims, 5 Drawing Sheets

(56) References Cited

FOREIGN PATENT DOCUMENTS

| | | |
|---|---|---|
| JP | 2002-284599 A | 10/2002 |
| JP | 2004-323348 A | 11/2004 |
| JP | 2005-29459 A | 2/2005 |
| JP | 2007-119273 A | 5/2007 |
| JP | 2007-230823 A | 9/2007 |
| JP | 2008-515748 A | 5/2008 |
| JP | 2010-235390 A | 10/2010 |
| JP | 2012-46377 A | 3/2012 |
| JP | 2013-47159 A | 3/2013 |
| WO | WO 2004/111318 A1 | 12/2004 |
| WO | WO 2006/041659 A2 | 4/2006 |

OTHER PUBLICATIONS

Bando et al., "Epitaxial dislocations dependence of electrical properties in 4H-SiC SBD", Proceedings of the 19th SiC and Related Wide Bandgap Semiconductors, 2010, pp. 140-141.
International Search Report, issued in PCT/JP2013/080935, dated Feb. 10, 2014.
Nagata et al., "A study of threading dislocations behavior during liquid phase epitaxial growth on on-axis 4H-SiC(0001) substrate", Proceedings of the 18th SiC and Related Wide Bandgap Semiconductors, 2009, pp. 68-69.
Nakamura et al., "Topographic study of dislocation structure in hexagonal SiC single crystals with low dislocation density", Journal of Crystal Growth, 2007, vol. 304, pp. 757-763.
Ohtani, "Structural defects in SiC single crystal substrates", Proceedings of the 17th SiC and Related Wide Bandgap Semiconductors, 2008, pp. 8.
Tsuchida et al., "Formation of basal plane Frank-type faults in 4H-SiC epitaxial growth", Journal of Crystal Growth, 2008, vol. 310, pp. 757-765.
Yamamoto et al., "Influence of Threading Dislocations on Gate Thermal Oxide", Proceedings of the 19th SiC and Related Wide Bandgap Semiconductors, 2010, pp. 11-12.
Extended European Search Report dated Jul. 27, 2016 for Application No. 13855667.5.

SILICON CARBIDE SINGLE CRYSTAL SUBSTRATE AND PROCESS FOR PRODUCING SAME

TECHNICAL FIELD

The present invention relates to a silicon carbide single crystal cut from a bulk silicon carbide single crystal grown by a Physical Vapor Transport method. More specifically, the present invention relates to a silicon carbide single crystal having partially decreased screw dislocations, wherein the number of screw dislocations generated in a semicircular region which is one-half of the substrate is smaller than that in the other semicircular region, and to a manufacturing method thereof.

BACKGROUND ART

Silicon carbide (SiC) is a wide band gap semiconductor having a wide band gap of 2.2 to 3.3 eV. Due to excellent physical and chemical characteristics thereof, SiC as a semiconductor material having environmental resistance is under research and development. In recent years, SiC has been used as a material for optical devices using the short wavelength range of from blue light to ultraviolet light, high frequency electronic devices, high voltage and high power electronic devices, and the like, and research and development for manufacturing SiC devices (semiconductor elements) have been vigorous.

In practical application of SiC devices, it is essential to manufacture SiC single crystals having a large diameter. In many cases, growing a bulk SiC single crystal by the Physical Vapor Transport (PVT) method has been employed (Lely Method or modified Lely Method). Specifically, a SiC sublimation raw material is contained in a crucible, then, a seed crystal composed of a SiC single crystal is attached to the lid of the crucible, and the raw material is sublimated, whereby recrystallization causes the SiC single crystal to grow on the seed crystal. Then, a SiC bulk single crystal (a SiC single crystal ingot) having a substantially cylindrical shape is obtained and then cut to a thickness of approximately 300 to 600 μm to manufacture a SiC single crystal substrate, which is used to form SiC devices in electric and electronic fields and the like.

A SiC single crystal contains hollow-core defects passing through in a growing direction, which are called micropipes, as well as crystal defects such as dislocation defects and stacking faults. These crystal defects deteriorate device performance. Therefore, the reduction of such defects is important in applications for SiC devices.

Among them, dislocation defects include threading edge dislocations, basal plane dislocations, and screw dislocations. For example, it has been reported that commercially available SiC single crystal substrates have approximately $8 \times 10^2$ to $3 \times 10^3$ (/cm$^2$) of screw dislocations, $5 \times 10^3$ to $2 \times 10^4$ (/cm$^2$) of threading edge dislocations, and $2 \times 10^3$ to $2 \times 10^4$ (/cm$^2$) of basal plane dislocations (see Non-Patent Literature 1).

In recent years, research and investigation relating to crystal defects of SiC and device performance has advanced and influences of the various defects are becoming clear. Among them, there are reports including leakage current in devices and decreased life of gate oxide film due to screw dislocations (see Non-Patent Literature 2 and 3). In order to form a high performance SiC device, at least, a SiC single crystal substrate having less screw dislocations is needed.

In addition, regarding the reduction of screw dislocations in a SiC single crystal, for example, there is a case reported in which the number of screw dislocations has been reduced to 67 (/cm$^2$) by metastable solvent epitaxy (MSE method) (Non-Patent Literature 4). Additionally, another report describes that screw dislocations are dissociated into Frank-type stacking faults during epitaxial growth by chemical vapor deposition method (CVD method) (see Non-Patent Literature 5). However, in both of these methods, the growth rate of the SiC single crystal is several micrometers per hour, which is 1/10 or less of the growth rate of an ordinary SiC single crystal in the PVT method. Thus, it is difficult to employ the methods as industrial production methods.

On the other hand, regarding the PVT method, there has been reported a method of obtaining a SiC single crystal having less micropipes and screw dislocations by growing a SiC single crystal as an initially grown layer at a predetermined growth pressure and a predetermined substrate temperature and then performing crystal growth while gradually decreasing the substrate temperature and the pressure (see Patent Literature 1). However, the screw dislocation density of the SiC single crystal obtained by this method is $10^3$ to $10^4$ (/cm$^2$) (see the section of "Advantageous Effects" in the specification of Patent Literature 1). Considering applications to high performance SiC devices, further reduction of screw dislocations is necessary.

In addition, there has been reported a method for suppressing the occurrence of micropipes and reducing dislocation density of screw dislocations and the like by growing a SiC single crystal as an initially grown layer at a predetermined growth pressure and a predetermined substrate temperature and then growing the crystal by reducing the pressure to increase growth rate while maintaining the substrate temperature as it is (see Patent Literature 2). However, even with this method, the effect of reducing screw dislocations is insufficient.

Additionally, in the PVT method, in addition to a screw dislocation having a Burgers vector of <0001>, a threading mixed dislocation is reported to have been generated from a threading edge dislocation with a Burgers vector of 1/3<11-20>(0001) propagating in the basal plane (see Non-Patent Literature 6). However, the phenomenon accidentally occurs during crystal growth, and there is no reported case in which it was controlled, as far as the present inventors know.

CITATION LIST

Patent Literature

[Patent Literature 1] Japanese Laid-open Patent Publication No. 2002-284599
[Patent Literature 2] Japanese Laid-open Patent Publication No. 2007-119273

Non-Patent Literature

[Non-Patent Literature 1] Noboru Ohtani, Proceedings of the 17th SiC and Related Wide Bandgap Semiconductors, 2008, P8.
[Non-Patent Literature 2] Bando et al., Proceedings of the 19th SiC and Related Wide Bandgap Semiconductors, 2010, p 140-141.
[Non-Patent Literature 3] Yamamoto et al., Proceedings of the 19th SiC and Related Wide Bandgap Semiconductors, 2010, p 11-12.

[Non-Patent Literature 4] Nagata et al., Proceedings of the 18th SiC and Related Wide Bandgap Semiconductors, 2009, p 68-69.
[Non-Patent Literature 5] H. Tsuchida et al., Journal of Crystal Growth, 310, (2008), 757-765.
[Non-Patent Literature 6] D. Nakamura et al., Journal of Crystal Growth, 304, (2007) 57-63.

SUMMARY OF INVENTION

In view of this, the present inventors conducted intensive and extensive studies in order to obtain a SiC single crystal substrate using the PVT method thought to be relatively advantageous in industrial productions. As a result, the present inventors surprisingly obtained a new finding that in the growth of a bulk SiC single crystal, by employing specific growth conditions during a part of the growth of the bulk SiC single crystal, in the SiC single crystal substrate cut from the subsequently grown SiC single crystal such that the substrate has a prescribed main surface, the number of screw dislocations generated in a semicircular region which is one-half of the substrate is smaller than that in the other semicircular region.

Then, with the use of a SiC single crystal substrate in which screw dislocations are reduced even partially, a high performance SiC device can be manufactured by selectively form a device in the substrate, and yield in the formation of a device is improved. These findings led the inventors to the completion of the present invention.

Accordingly, an object of the present invention is to provide a silicon carbide single crystal substrate obtained from a bulk SiC single crystal grown by the PVT method, which substrate has partially decreased screw dislocations, wherein the number of screw dislocations generated in a semicircular region which is one-half of the substrate is smaller than that in the other semicircular region, and to provide a manufacturing method thereof.

Specifically, the gist of the present invention is as follows:
(1) A silicon carbide single crystal substrate cut from a bulk silicon carbide single crystal grown by a physical vapor transport method, wherein average value of screw dislocation densities observed at a plurality of measurement points in one semicircular region which is one-half of the substrate is not more than 80% of an average value of screw dislocation densities observed at a plurality of measurement points in one semicircular region which is the other one-half of the substrate.
(2) The silicon carbide single crystal substrate according to (1), wherein the substrate has a main surface having an angle $\theta_w$ of more than 0° and not more than 12°, the angle $\theta_w$ being formed by the normal penetrating center point O of the substrate and the [0001] direction; when two semicircular regions bounded by a diameter $R_\perp$ of the substrate are defined, the diameter $R_\perp$ being perpendicular to the virtual direction V obtained by projecting the [0001] direction axis on the main surface from the center point O, the average value of screw dislocation densities observed at a plurality of measurement points in a first semicircular region which is one of the semicircular regions is not more than 80% of the average value of screw dislocation densities observed at a plurality of measurement points in a second semicircular region which is the other semicircular region.
(3) The silicon carbide single crystal substrate according to (2), wherein the average value of screw dislocation densities observed at a plurality of measurement points in the first semicircular region is not more than 60% of the average value of screw dislocation densities observed at a plurality of measurement points in the second semicircular region.
(4) The silicon carbide single crystal substrate according to (2), wherein the average value of screw dislocation densities observed at a plurality of measurement points in the first semicircular region is not more than 50% of the average value of screw dislocation densities observed at a plurality of measurement points in the second semicircular region.
(5) The silicon carbide single crystal substrate according to any one of (2) to (4), wherein when a sectoral region having a central angle of ±45° from a radius $r_\parallel$ which equally divides the first semicircular region is defined, the average value of screw dislocation densities observed at a plurality of measurement points in the sectoral region is not more than 40% of the average value of screw dislocation densities observed at a plurality of measurement points in the second semicircular region.
(6) The silicon carbide single crystal substrate according to any one of (2) to (4), wherein when a sectoral region having a central angle of ±45° from a radius $r_\parallel$ which equally divides the first semicircular region is defined, the average value of screw dislocation densities observed at a plurality of measurement points in the sectoral region is not more than 30% of the average value of screw dislocation densities observed at a plurality of measurement points in the second semicircular region.
(7) The silicon carbide single crystal substrate according to any one of (2) to (6), wherein the substrate has an off angle corresponding to the angle $\theta_w$, of which off direction $d_w$ is <11-20> direction.
(8) The silicon carbide single crystal substrate according to any of (2) to (4), wherein 24 radii $r_1$ to $r_{24}$ extending radially from the center point O of the substrate set to 0 are regarded as axes, each scaled from 0 to 1, the 24 radii $r_1$ to $r_{24}$ existing in 12 diameters dividing the circumference of the substrate into 24 equal parts, respectively, the average value of the screw dislocation densities observed in the first semicircular region is an average of values measured at all of 27 measurement points of i) to iii) below and the average value of the screw dislocation densities observed in the second semicircular region is an average of values measured at all of 22 measurement points of iv) to v) below:
i) center point O
ii) $a_1$ to $a_{13}$
iii) $b_1$ to $b_{13}$
iv) $a_{14}$ to $a_{24}$
V) $b_{14}$ to $b_{24}$
(wherein numerals appended to symbols a and b correspond to numerals of the radii $r_1$ to $r_{24}$ and, for example, $a_1$ and $b_1$ represent measurement points present on the radius $r_1$; among the measurement points, "a" represents measurement points present within a range of from more than 0 and not more than 0.5 in each radius, and "b" represents measurement points present within a range of from more than 0.5 and not more than 1; and 24 measurement points having the same symbol are present on the same circle of each of the symbols a and b; one of the two radii existing in the diameter $R_1$ is $r_1$ and the radius adjacent to $r_1$ and located in the first semicircular region is defined as $r_2$, and the reference numbers of radii are serially allocated along the direction of the circumference).
(9) The silicon carbide single crystal substrate according to (8), wherein the average value of screw dislocation densities observed in the first semicircular region is not more than 600/cm$^2$.
(10) The silicon carbide single crystal substrate according to (5) or (6), wherein 24 radii $r_1$ to $r_{24}$ extending radially from the center point O of the substrate set to 0 are regarded as axes, each scaled from 0 to 1, the 24 radii $r_1$ to $r_{24}$ existing in 12 diameters dividing the circumference of the substrate into 24 equal parts, respectively, the average value of the screw dislocation densities observed in the sectoral region is an average of values measured at all of 15 measurement points of i), vi) and vii) below and the average value of the screw dislocation densities observed in the second semicircular region is an average of values measured at all of 22 measurement points of iv) to v) below:

i) center point O
vi) $a_4$ to $a_{10}$
vii) $b_4$ to $b_{10}$
iv) $a_{14}$ to $a_{24}$
v) $b_{14}$ to $b_{24}$ (wherein numerals appended to symbols a and b correspond to numerals of the radii $r_1$ to $r_{24}$ and, for example, $a_1$ and $b_1$ represent measurement points present on the radius $r_1$; among the measurement points, "a" represents measurement points present within a range of from more than 0 and not more than 0.5 in each radius, and "b" represents measurement points present within a range of from more than 0.5 and not more than 1; 24 measurement points having the same symbol are present on the same circle of each of the symbols a and b; one of the two radii existing in the diameter $R_1$ is $r_1$ and the radius adjacent to $r_1$ and located in the first semicircular region is defined as $r_2$, and the reference numbers of radii are serially allocated along the direction of the circumference).

(11) The silicon carbide single crystal substrate according to (10), wherein the average value of screw dislocation densities observed in the sectoral region is not more than 400/$cm^2$.

(12)

A method for manufacturing a silicon carbide single crystal by a physical vapor transport method using a seed crystal, the method being characterized by including:

(i) a first growth step of growing a silicon carbide single crystal having a thickness of at least 1 mm at a first growth atmosphere pressure of not lower than 0.13 kPa and not higher than 2.6 kPa and a first growth temperature in which the temperature of the seed crystal is not lower than 2100° C. and not higher than 2400° C.;

(ii) a second growth step of growing the silicon carbide single crystal having a thickness of at least 0.5 mm at a second growth atmosphere pressure of not lower than 2.6 kPa and not higher than 65 kPa and a second growth temperature in which the temperature of the seed crystal is not lower than 2100° C. and not higher than 2400° C.; and (iii) a third growth step of growing the silicon carbide single crystal to a larger thickness than in the first growth step at a third growth atmosphere pressure of not lower than 0.13 kPa and not higher than 2.6 kPa and a third growth temperature in which the temperature of the seed crystal is not lower than 2100° C. and not higher than 2400° C.;

wherein the seed crystal is composed of SiC single crystal and has an off angle $\theta_s$ of more than 0° and not more than 16° relative to (0001) plane.

(13)

A method for manufacturing a silicon carbide single crystal by a physical vapor transport method using a seed crystal, the method being characterized by including:

(i) a first growth step of growing a silicon carbide single crystal having a thickness of at least 1 mm at a first growth atmosphere pressure of not lower than 0.13 kPa and not higher than 2.6 kPa and a first growth temperature in which the temperature of the seed crystal is not lower than 2100° C. and not higher than 2400° C.;

(ii) a second growth step of growing the silicon carbide single crystal having a thickness of at least 0.5 mm at a second growth atmosphere pressure of not lower than 2.6 kPa and not higher than 65 kPa and a second growth temperature in which the temperature of the seed crystal is not lower than 2100° C. and not higher than 2400° C.; and (iii) a third growth step of growing the silicon carbide single crystal to a larger thickness than in the first growth step at a third growth atmosphere pressure of not lower than 0.13 kPa and not higher than 2.6 kPa and a third growth temperature in which the temperature of the seed crystal is not lower than 2100° C. and not higher than 2400° C.;

wherein the seed crystal is composed of SiC single crystal and has an off angle $\theta_s$ of more than 4° and not more than 16° relative to (0001) plane.

(14)

The method for manufacturing a silicon carbide single crystal according to (12) or (13), wherein the first and the second growth atmosphere pressures are changed to the second and the third growth atmosphere pressures, respectively, at a pressure changing rate of 13.3 kPa or less per hour.

(15)

The method for manufacturing a silicon carbide single crystal according to any one of (12) to (14), wherein the first and the second growth temperatures are changed to the second and the third growth temperatures, respectively, at a temperature changing rate of 40° C. or less per hour.

(16)

The method for manufacturing a silicon carbide single crystal according to any one of (12) to (15), wherein crystal growth rate in the second growth step is 100 μm/hr or less.

Advantageous Effects of Invention

The SiC single crystal substrate of the present invention is one cut from a bulk SiC single crystal grown by the PVT method, wherein the number of screw dislocations generated in a semicircular region which is one-half of the substrate is smaller, preferably much smaller, than that in the other semicircular region. Therefore, a high performance SiC device can be manufactured by selectively form a device in the substrate. Further, since manufacturing of devices depending on the distribution of the screw dislocations can be easily carried out, the yield in the manufacture of a device is improved. Thus, the present invention is very advantageous industrially.

Figure 1:
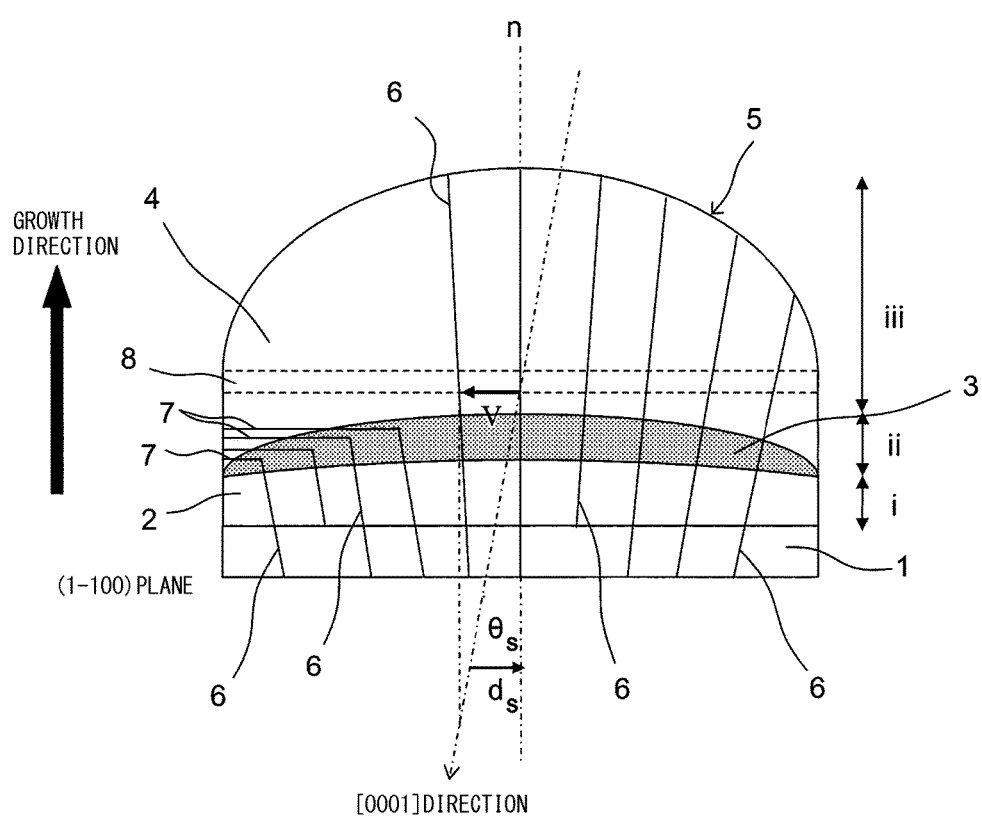
FIG. 1 is a cross-sectional schematic view illustrating a bulk SiC single crystal used to obtain a SiC single crystal substrate of the present invention.

Hereinafter, the present invention will be described in more detail.

The SiC single crystal substrate according to the present invention is cut from a bulk SiC single crystal grown by the PVT method. As described above, there are reported cases in which screw dislocations were successfully reduced in crystal growth in the MSE method and epitaxial growth of SiC in the CVD method. However, the epitaxial growth of SiC by the MSE method or the CVD method is performed at a growth rate of 1/10 or less of the growth rate of an ordinary SiC single crystal grown by the PVT method and is completely different, in terms of the level of productivity, from a manner of manufacturing by cutting from a bulk SiC single crystal grown by the PVT method, as in the SiC single crystal substrate of the present invention. Further, by the MSE method or the CVD method, a SiC epitaxial film is usually grown on the base SiC substrate to obtain a SiC epitaxial substrate. Therefore, the existence form of the screw dislocations in the substrate is different from that in the SiC single crystal substrate cut from a bulk SiC single crystal grown by the PVT method as in the present invention. More specifically, while screw dislocations exist as they are in the base SiC substrate in a SiC epitaxial substrate obtained by the MSE method or the like, in the SiC single crystal substrate of the present invention, the screw dislocations are decreased at least in a semicircular region through the direction of thickness of the substrate.

The present inventors conducted intensive and extensive studies on means for obtaining a SiC single crystal substrate having less screw dislocations by using the PVT method and, as a result, found that, when growing a bulk SiC single crystal, screw dislocation or the threading mixed dislocation (in the present specification, these are together referred to as "screw dislocation") can be structurally converted by employing specific conditions during the growth.

More specifically, in a bulk SiC single crystal formed by the PVT method, screw dislocations generated by succession from the seed crystal or generated at the interface with the seed crystal exist in substantially parallel to the c axis. In more detail, screw dislocations have a property to extend in the direction of the normal of the isothermal line during the growth. In the PVT method, generally, in order to obtain a stable polytype SiC single crystal, there is provided a temperature gradient lower in the center region of the grown crystal than in the peripheral region thereof (usually, the temperature in the center region is lower by about more than 0° C. and about not more than 20° C.) to form a bulk SiC single crystal while maintaining a protruded crystal growth surface. Thus, since the isothermal line during the growth has a protruded shape, strictly speaking, the directions of extension of the screw dislocations differ from surface to surface of the growing crystal.

On the other hand, since screw dislocations in the crystal have a Burgers vector in the <0001> direction, screw dislocations most stably exist when they extend in this direction. Therefore, when the direction of extension of screw dislocations is shifted from the <0001> direction, such screw dislocations are in an unstable state because the distortion of the crystal lattice is increased so that the energy state seems to be high. In view of this, in the present invention, by creating an equilibrium state or a quasi-equilibrium state in the PVT method during the growth of the crystal, the screw dislocations in an unstable state are structurally converted so as to obtain a SiC single crystal substrate in which the screw dislocations are partially decreased.

More specifically, as depicted in FIG. 1, first, (i) an initially grown layer 2 of a SiC single crystal is grown on a seed crystal 1, and then (ii) a structural conversion layer 3 is grown by creating the equilibrium state or the quasi-equilibrium state. Here, "the equilibrium state or the quasi-equilibrium state" in the PVT method means a state wherein the difference between the amount of attached atoms when the SiC sublimation raw material is sublimated and recrystallized in a crucible and the amount of atoms leaving from the crystal surface in the sublimation is small. Therefore, the growth rate is much smaller than in the cases of the (i) initially grown layer 2 and (iii) the main grown crystal 4 which is subsequently grown. During this time, among the screw dislocations 6 generated in the initially grown layer 2, those which are unstable energetically stop their extension to the direction of the crystal growth and are structurally converted to a more stable state such as stacking faults 7 and basal plane dislocations (not depicted). In particular, in the region opposite to the off direction $d_s$ originated from the off angle $\theta_s$ of the seed crystal 1, since the difference of directions between the direction of extension of screw dislocations 6 and the <0001> direction is large, the screw dislocations 6 existing in this region are in a more unstable state, and hence, the probability that the structural conversion occurs is thought to increase.

Since the direction of extension of the stacking faults and basal plane dislocations is substantially perpendicular to the growing direction of the crystal, they are expelled outside from the side surface of the crystal as the growth proceeds. Accordingly, by using such a structural conversion in the PVT method, in the (iii) subsequently grown crystal 4, the screw dislocations 6 are decreased (without including stacking faults and the like), so that a bulk SiC single crystal 5 in which the screw dislocations are decreased in one-half region in the longitudinal cross-section can be obtained. The schematic cross-sectional view depicted in FIG. 1 illustrates the case wherein the SiC single crystal is grown on the SiC seed crystal having an off angle $\theta_s$ relative to the (000-1) plane, and schematically depicts the state of the (1-100) plane of the bulk SiC single crystal 5. On the other hand, when a SiC single crystal is grown on a SiC seed crystal having an off angle $\theta_s$ relative to the (0001) plane, since the difference in the directions of the off direction $d_s$ originated from the off angle $\theta_s$ and the <0001> direction is large in the region located on the same side as the off direction $d_s$, the screw dislocations 6 existing therein are in a more unstable state, and hence, the probability that the structural conversion occurs is believed to increase.

In obtaining such a bulk SiC single crystal 5, when the initially grown layer 2 is grown in the step (i), usual growth conditions in the PVT method can be employed. In the present invention, converting the screw dislocations in the structural conversion layer 3 during the step (ii) has been taken into consideration. Since the screw dislocations 6 in the bulk SiC single crystal 5 are mainly those generated by succession from the seed crystal 1 or generated at the interface with the seed crystal 1, it is acceptable to generate these screw dislocations in the step (i) in the same manner as in the conventional method.

Specifically, the temperature (growth temperature) of the seed crystal 1 is desirably not lower than 2100° C. and not higher than 2400° C., preferably not lower than 2200° C. and not higher than 2300° C. The growth atmosphere pressure is desirably not lower than 0.13 kPa and not higher than 2.6 kPa, preferably not lower than 0.65 kPa and not higher than 1.95 kPa. The initially grown layer 2 is grown under the conditions combining these conditions at a growth rate of, for example, not less than 100 μm/h, preferably not less than 300 μm/h. In view of sufficiently growing the screw dislocations 6 along the growth direction, the thickness of the initially grown layer 2 grown on the seed crystal 1 is desirably not less than 1 mm, preferably not less than 2 mm. However, in view of the fact that its effect is saturated and in view of the productivity and so on of the SiC single crystal substrate finally cut from the bulk SiC single crystal 5, the thickness of the initially grown layer 2 is preferably not more than 10 mm.

Regarding the growth conditions of the structural conversion layer 3 in the step (ii), the growth conditions are acceptable as long as the equilibrium state or the quasi-equilibrium state in the PVT method is created so that the screw dislocations in the unstable state are structurally converted. Usually, by increasing the growth atmosphere pressure, the amount of the atoms reaching the crystal growth surface is decreased because the diffusion of the raw material gas of the SiC sublimation raw material is slowed. On the other hand, the amount of the atoms leaving from the crystal surface is determined by the growth surface temperature. Accordingly, when the structural conversion layer 3 is grown, specifically, the temperature of the seed crystal 1 is desirably not lower than 2100° C. and not higher than 2400° C., preferably not lower than 2200° C. and not higher than 2300° C., and the growth atmosphere pressure is desirably higher than 2.6 kPa and not higher than 65 kPa, preferably not lower than 6.5 kPa and not higher than 39 kPa. In contrast to the fact that the usual growth rate of a SiC single crystal by the PVT method is about 100 to about 1000 μm/h, when the structural conversion layer 3 is grown in (ii), by the combination of the above-mentioned growth temperature and the growth atmosphere pressure, the desired conversion of the screw dislocations is sought at a low growth rate of less than 100 μm/h, preferably not more than 50 μm/h, more preferably not more than 25 μm/h. In view of the growth efficiency and so on, it is desired to set the growth rate of the structural conversion layer 3 to not less than 1 μm/h.

The thickness of the structural conversion layer 3 is desirably at least 0.5 mm, preferably not less than 1 mm. When the thickness of the structural conversion layer 3 is less than 0.5 mm, the structural conversion from the screw dislocations to the stacking faults or the like may not be attained sufficiently. On the other hand, although the structural conversion of the screw dislocations is enhanced with the increase in the thickness of the structural conversion layer 3, in view of the fact that the effect is saturated and in view of the productivity and so on, it is sufficient to set the upper limit of the thickness of the structural conversion layer 3 to 10 mm.

After growing the structural conversion layer 3 in (ii), the main grown crystal 4 may be grown at an increased growth rate in the step (iii). As mentioned above, since the screw dislocations 6 in an unstable state are structurally converted to stacking faults, basal plane dislocations or the like in the structural conversion layer 3, the screw dislocations are decreased in the specific region in the crystal grown thereafter. Therefore, normal growth conditions in the PVT method can be employed, specifically, as the conditions for growing the main grown crystal 4, the growth temperature and the growth atmosphere pressure mentioned in the description of the initially grown layer 2 in (i) can be employed. Under these conditions, in view of the productivity and so on, the growth rate is desirably not less than 100 μm/h, preferably not less than 300 μm/h. In view of the fact that the main grown crystal 4 is the main grown part in the bulk SiC single crystal 5, and that the SiC single crystal substrate 8 is cut from the obtained bulk SiC single crystal 5, the thickness of the main grown crystal 4 grown after forming the structural conversion layer 3 is desirably not less than 10 mm. In view of using an existing equipment, the upper limit of the growth rate of the crystal is about 2000 μm/h (including the case of (i)), and the upper limit of the thickness of the main grown crystal 4 is about 200 mm.

As described above, the bulk SiC single crystal 5 is obtained through at least three growth steps (i) to (iii). Regarding the growth atmosphere pressure, among these steps, the growth atmosphere pressure is set to be highest in the step (ii). On the other hand, regarding the growth temperature (seed crystal temperature), in view of the fact that a higher growth temperature results in higher temperature of the SiC sublimation raw material and, in turn, increasing the sublimated raw material to increase the growth rate, the temperature of the step (iii) may be set to be the highest. Alternatively, a constant growth temperature may be maintained throughout the steps (i) to (iii). When changing the growth temperature or the growth atmosphere pressure between the steps, since larger amplitude of the change per unit of time results in the larger change per time in growth rate, the crystal growth during the change is unstable and crystal defects such as the coexistence of a different poly type can occur. Accordingly, it is desired to change the pressure preferably at a rate of 13.3 kPa or less per hour, more preferably at a rate of 1.33 kPa or less per hour. For the same reason, it is desired to change the temperature preferably at a rate of 40° C. or less per hour, more preferably at a rate of 10° C. or less per hour.

In the present invention, as the seed crystal 1 used for obtaining the bulk SiC single crystal 5, it is preferred to use a SiC single crystal composed of SiC single crystal and having an off angle $\theta_s$ relative to the (0001) plane. In other words, it is preferred that the normal of the SiC seed crystal substrate have an off angle $\theta_s$ relative to the (0001) plane, and that the off direction $d_s$ be the <11-20> direction. To attain the desired structural change of the screw dislocations described above, it is important that the seed crystal 1 have an off angle $\theta_s$ of more than 0°. By this, among the screw dislocations generated in the initially grown layer 2, those in an energetically unstable state are concentrated to the region opposite to the off direction $d_s$, and structurally converted in the structural conversion layer 3. Although the off angle $\theta_s$ is not limited, a larger off angle is preferred because the effect of concentrating those in the energetically unstable state in a specific region is promoted. For example, the off angle $\theta_s$ may be more than 4° or more than 8°. On the other hand, since the present inventors have confirmed that when the off angle is too large, the probability that the coexistence of a different poly type occurs is increased, the off angle is desirably not more than 16°, preferably not more than 12°.

As depicted in FIG. 1, the SiC single crystal substrate 8 of the present invention can be obtained by cutting from the main grown crystal 4 in the thus obtained bulk SiC single crystal 5. The SiC single crystal substrate 8 can be obtained from the main grown crystal 4 by a known method, and may be obtained by, for example, cutting the SiC single crystal at a prescribed thickness by using a multiwire saw, electric discharge machining method or the like, and then performing various polishing or the like. The thickness of the SiC single crystal substrate 8 is not limited and can be appropriately selected depending on the use thereof, the type of the device to be constructed, and so on.

Figure 3:
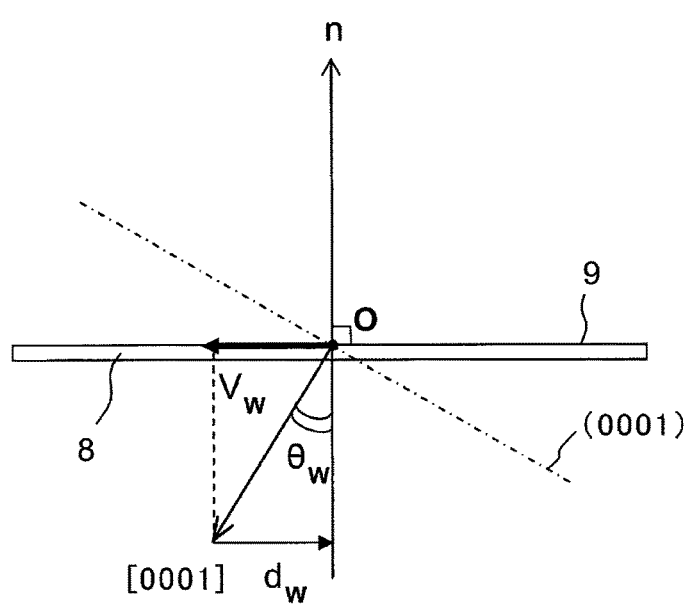
FIG. 3 is a schematic view illustrating an off angle $\theta_w$ and an off direction $d_w$ in a SiC single crystal substrate of the present invention.

The SiC single crystal substrate 8 can be taken out from the bulk SiC single crystal 5 at a highest efficiency when the substrate is cut such that it has a cross section perpendicular to the direction of the crystal growth. In this case, in the obtained SiC single crystal substrate 8, the off angle $\theta_w$ formed by the normal n penetrating the center point O of the substrate and [0001] is identical to the off angle $\theta_s$ of the seed crystal 1, and its off direction $d_w$ is also identical to the off direction $d_s$ of the seed crystal 1. Thus, the SiC single crystal 8 in this case has an off angle $\theta_w$ (=off angle $\theta_s$) between the normal n penetrating the center point O of the substrate and [0001], and has a main surface of which off direction $d_w$ (=off direction $d_s$) is [11-20] direction. As depicted in FIG. 3, the off angle $\theta_w$ herein means the angle formed by the normal (here, the normal n penetrating the center point O of the substrate) of the main surface 9 (surface of the substrate) of the SiC single crystal 8 and the [0001] direction (the direction of c axis). The off direction $d_w$ corresponds to the opposite direction of the vector obtained by projecting the [0001] direction on the main surface 9.

Figure 2:
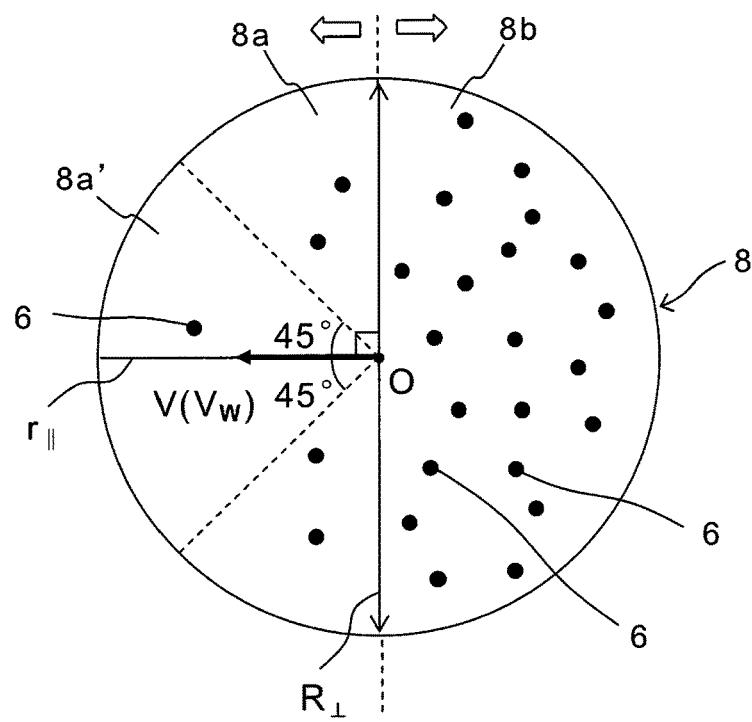
FIG. 2 is a plan schematic view illustrating a SiC single crystal substrate of the present invention.

For example, in the SiC single crystal substrate 8 cut from the bulk SiC single crystal 5 depicted in FIG. 1 as described above, when a diameter $R_\perp$ is defined as the diameter perpendicular to the virtual direction $V_w$ obtained by projecting the [0001] direction axis on the main surface, the screw dislocation densities in a first semicircular region 8a which is one of the semicircular regions bounded by the diameter $R_\perp$ are decreased when compared with those in the second semicircular region 8b opposite to the virtual direction $V_w$, as depicted in FIG. 2. When the bulk SiC single crystal 5 is obtained by employing the the (000-1) plane of the SiC seed crystal 1 as the growth surface in the explanation depicted in FIG. 1, in the SiC single crystal substrate 8 cut therefrom, the first semicircular region 8a is opposite to the virtual direction $V_w$, in which the number of screw dislocations is smaller than in the second semicircular region 8b in the side of the virtual direction $V_w$. In defining the first and second semicircular regions 8a and 8b, the diameter $R_\perp$ which is a boundary line may be included in one of the semicircular regions or may not be included in any of the semicircular regions.

Figure 4:
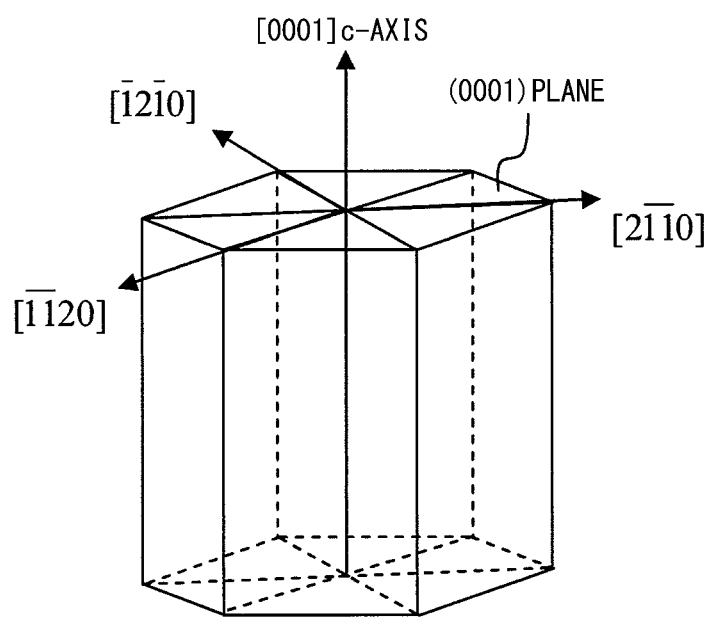
FIG. 4 is a schematic view illustrating some directions in a hexagonal crystal.

On the other hand, in view of the use, the post treatment such as forming an epitaxial film, and so on, the off angle $\theta_w$ of the SiC single crystal substrate 8 may be arbitrarily selected. Specifically, a SiC single crystal substrate 8 may be obtained, which substrate has an off angle $\theta_w$ different from the off angle $\theta_s$ of the seed crystal 1, of which off direction $d_w$ is <11-20> direction, by appropriately selecting the direction when the substrate is cut from the main grown crystal 4. Here, although the off angle $\theta_w$ is not limited, the off angle $\theta_w$ is desirably not more than 12° in order to obtain a smooth growth surface, and preferably not more than 8° in view of obtaining a larger number of substrates from the bulk SiC single crystal (ingot). As depicted in FIG. 4, there are [11-20] direction, [-2110] direction, [-12-10] direction, [-1-120] direction, [2-1-10] direction and [1-210] direction as the plane directions equivalent to the <11-20> direction.

The SiC single crystal substrate 8 of the present invention is a silicon carbide single crystal substrate having partially decreased screw dislocations, wherein the number of screw dislocations generated in a semicircular region which is one-half of the substrate is smaller than that in the other semicircular region. More specifically, the average value of screw dislocation densities observed at a plurality of measurement points in the first semicircular region 8a is not more than 80%, preferably not more than 60%, more preferably as low as not more than 50%, of the average value of screw dislocation densities observed at a plurality of measurement points in the second semicircular region 8b. Further, when a sectoral region 8a' having a central angle of ±45° from a radius $r_\parallel$ which equally divides the first semicircular region is defined (FIG. 2), the average value of screw dislocation densities observed at a plurality of measurement points in this sectoral region 8a' is not more than 70%, preferably not more than 40%, more preferably not more than 30%, of the average value of screw dislocation densities observed at a plurality of measurement points in the second semicircular region 8b.

The method for measuring the respective average values of the screw dislocations in the first semicircular region 8a and in the second semicircular region 8b is not particularly limited. However, the most common method employed can be etching the substrate surface by immersion in molten KOH at approximately 500° C. and then observing the shape of an etched pit through an optical microscope to measure a screw dislocation density. Then, through the optical microscope, screw dislocation density can be measured at plural measurement points in the respective regions to obtain respective average values.

In this case, in order to suitably determine whether the substrate has lower screw dislocation density in the first semicircular region 8a than the second semicircular region 8b bounded by the diameter $R_\perp$, for example, it is preferable to select measurement points in the respective regions in a manner as described below to measure screw dislocation densities so as to obtain the respective average values. However, the selection of the measurement points described below is merely one example and obviously, the present invention is not limited thereto.

Figure 5:
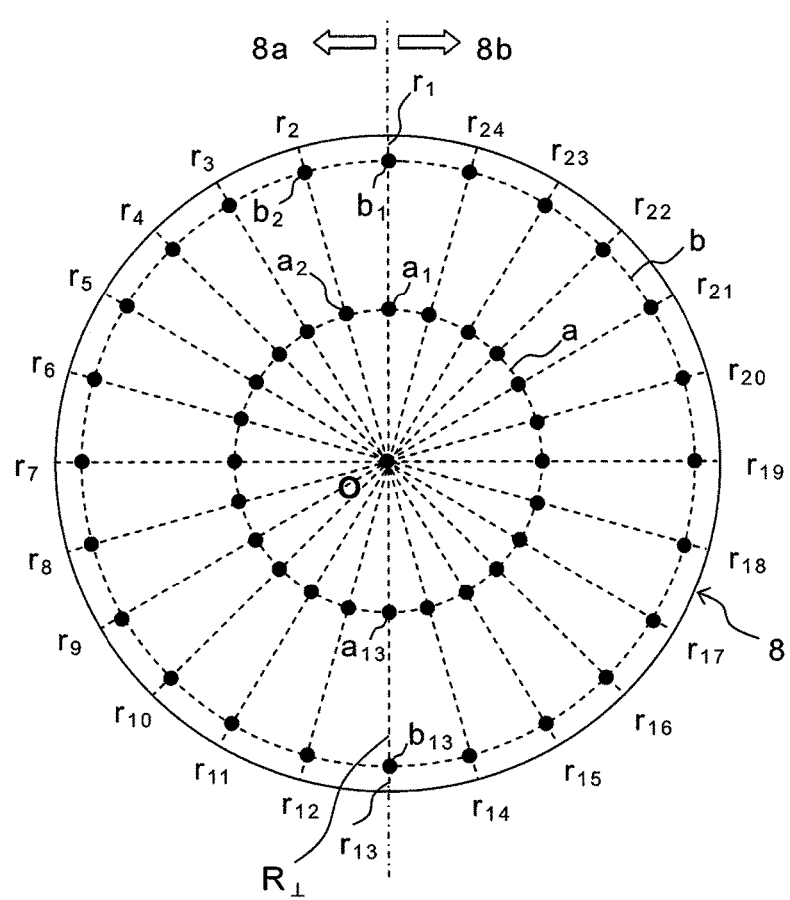
FIG. 5 is a plan schematic view depicting one example of measurement points selected when obtaining respective average values of screw dislocation densities observed in the first semicircular region and the second semicircular region of the SiC single crystal substrate.

More specifically, 24 radii $r_1$ to $r_{24}$ extending radially from the center point O of the substrate set to 0 are selected in the substrate and regarded as axes, each scaled from 0 to 1, the 24 radii $r_1$ to $r_{24}$ existing in 12 diameters dividing the circumference of the substrate into 24 equal parts, respectively, as depicted in FIG. 5, the average value of the screw dislocation densities observed in the first semicircular region 8a is determined from the average of values measured at total 27 measurement points of i) to iii) below. Similarly, the average value of the screw dislocation densities observed in the second semicircular region 8b is determined from the average of values measured at total 22 measurement points of iv) to v) below. In this case, the measurement points on the diameter $R_\perp$ are included in the first semicircular region 8a.

i) center point O
ii) $a_1$ to $a_{12}$
iii) $b_1$ to $b_{13}$
iv) $a_{14}$ to $a_{24}$
v) $b_{14}$ to $b_{24}$ The numerals appended to symbols a and b correspond to numerals of the radii $r_1$ to $r_{24}$ and, for example, $a_1$ and $b_1$ represent measurement points present on the radius $r_1$. Among the measurement points, "a" represents measurement points present within a range of from more than 0 and not more than 0.5 in each radius, and "b" represents measurement points present within a range of from more than 0.5 and not more than 1. Here, the scale 0 corresponds to the center point O of the substrate, and the scale 1 represents the position corresponds to the point on the circumference of the substrate. The 24 measurement points having the same symbol are present on the same circle of each of the symbols a and b. One of the two radii existing in the diameter $R_1$ is $r_1$ and the radius adjacent to $r_1$ and located in the first semicircular region is defined as $r_2$, and the numerals of radii are serially allocated along the direction of the circumference. Thus, the radii $r_1$ to $r_{13}$ exist in the first semicircular region 8a, and radii $r_{14}$ to $r_{24}$ exist in the second semicircular region 8b.

In the SiC single crystal substrate 8 of the present invention, for example, the average value of the screw dislocation densities observed in the second semicircular region 8b is about $1250/cm^2$, while the average value of the screw dislocation densities observed in the first semicircular region 8a is not more than $950/cm^2$. More specifically, the average value of the screw dislocation densities observed in the second semicircular region 8b is mainly within the range of 800 to $1500/cm^2$, while the average value of the screw dislocation densities observed in the first semicircular region 8a is not more than $600/cm^2$, preferably not more than $400/cm^2$. In other words, the average value of the screw dislocation densities observed in the first semicircular region 8a is not more than 80%, preferably not more than 60%, more preferably not more than 50%, of the average value of the screw dislocation densities observed in the second semicircular region 8b. The lower limit of the average value of the screw dislocation densities observed in the first semicircular region 8a is, theoretically, 0.1 dislocation/$cm^2$. However, in view of the fact that screw dislocations are inevitably generated by factors disturbing the growth, such as impurities contained in the raw material and attachment of the graphite from the wall surface of a graphite crucible, the practical lower limit at present is thought to be 1 dislocation/$cm^2$.

In order to suitably determine whether the substrate has a lower screw dislocation density in the sectoral region 8a' than in the second semicircular region 8b, the average value of the screw dislocation density in the sectoral region 8a' is preferably determined from the measurement values at the total 15 measurement points i), vi) and vii) among the measurement points depicted in FIG. 5.

i) center point O
vi) $a_4$ to $a_{10}$
vii) $b_4$ to $b_{10}$

The average value of the screw dislocation densities observed in the sectoral region 8a' is not more than $400/cm^2$, preferably not more than $250/cm^2$. Thus, the average value of the screw dislocation densities observed in the sectoral region 8a' is not more than 70%, preferably not more than 40%, more preferably not more than 30%, of the average value of the screw dislocation densities observed in the second semicircular region 8b. Regarding the lower limit of the average value of the screw dislocation densities observed in the sectoral region 8a', the same explanation as for the first semicircular region 8a is applied.

Since the structural conversion described above is utilized in the present invention, there is no limitation by the polytype of the bulk SiC single crystal 5. Therefore, it is applicable for obtaining a bulk SiC single crystal such as 4H type as a typical polytype, 6H type, and 3C type. In particular, the present invention is advantageous because it is applicable to the 4H type SiC single crystal substrate 8 expected to be more promising as applications to power devices. Furthermore, an apparatus for manufacturing a silicon carbide single crystal using a commonly used the PVT method can be used. Accordingly, for example, nitrogen doping or the like can be appropriately performed in crystal according to the purpose of use while controlling the amount of nitrogen gas or the like supplied into a growth atmosphere through a high purity gas pipe or a mass flow controller. Furthermore, regarding the crystal diameter of the obtained bulk SiC single crystal substrate 8, although there is a limitation posed by the apparatus for producing the bulk SiC single crystal 5, there is no theoretical limitation in applying the principle of the present invention.

The SiC single crystal substrate 8 of the present invention has partially decreased screw dislocations, and specifically, the screw dislocation density observed in the first semicircular region 8a is not more than 80%, or less, of the screw dislocation density observed in the conventional substrates. Thus, by using the semicircular region in which the screw dislocations are decreased, high performance devices in which the leakage current and decrease in the life time of the oxide film caused by the screw dislocations are small can be produced, so that the production of high performance SiC devices can be easily realized. For example, it is suitable for producing MOSFET, JFET and the like. In addition, it is advantageous that devices of high quality can be obtained, since, for example, the reliability of oxide film in transistors can be greatly improved. Further, since the production of devices depending on the distribution of the screw dislocations can be easily attained, the overall yield in the device production can also be improved.

EXAMPLES

Hereinafter, the present invention will be described in more detail with reference to Examples and the like. The present invention is not limited the content of the Examples below.

Figure 6:
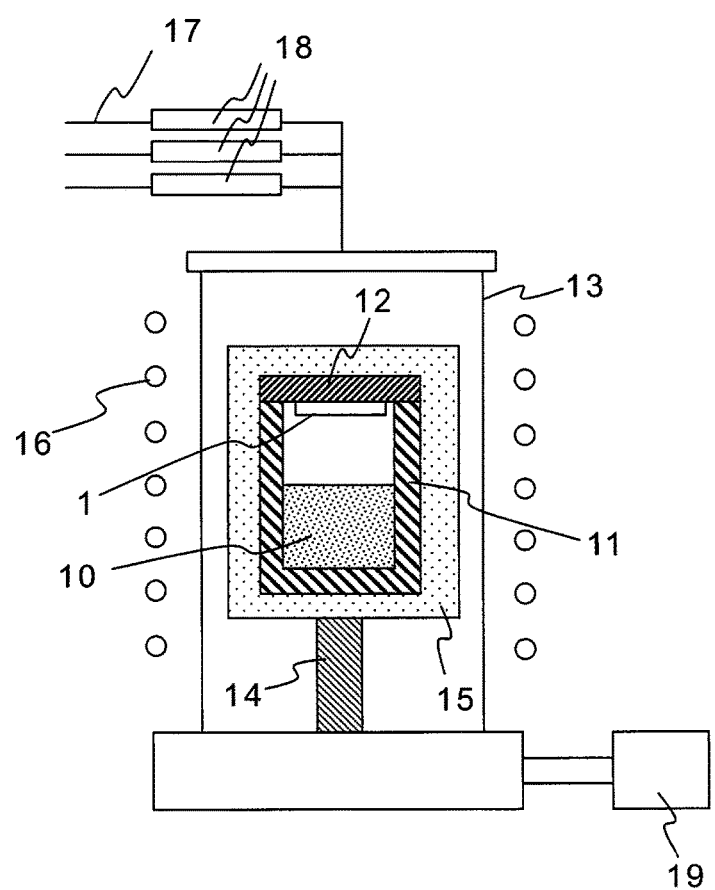
FIG. 6 is a cross-sectional schematic view depicting a single crystal manufacturing apparatus for manufacturing the bulk SiC single crystal used to obtain the SiC single crystal substrate of the present invention.

FIG. 6 depicts one example of an apparatus for growing a single crystal by a modified Lely Method (the PVT method), which is an apparatus for manufacturing a bulk SiC single crystal 5 used to obtain a SiC single crystal substrate 8 according to an Example of the present invention. Crystal is grown by sublimating a SiC sublimation raw material 10 by induction heating to recrystallize on a SiC seed crystal 1. The seed crystal 1 is attached onto an inner surface of a graphite lid 12, and the sublimation raw material 10 is filled in a graphite crucible 11. The graphite crucible 11 and the graphite lid 12 are covered with a graphite felt 15 for thermal shielding and disposed on a graphite supporting rod 14 inside a double quartz tube 13. The inside of the double quartz tube 13 is vacuum evacuated by a vacuum pumping device 19 and then high purity Ar gas or nitrogen gas is flown therein through a pipe 17 while controlling by a mass flow controller 18. While regulating pressure in the quartz tube (a growth atmosphere pressure) by the vacuum pumping device 19, a high frequency current is applied to a work coil 16 to heat the graphite crucible 11 so as to perform crystal growth. Herein, growth temperature was a temperature of the SiC seed crystal 1.

Example 1

First, a SiC single crystal substrate having a diameter of 75 mm was cut from a bulk SiC single crystal obtained in advance, subjected to mirror surface polishing to prepare a seed crystal 1 having an off angle of 4 degrees in a (0001) plane. The normal of the SiC seed crystal substrate has an off angle $\theta s=4°$ with respect to the [0001] direction, and the off direction $d_s$ is the [11-20] direction. The seed crystal 1 was attached to the inner surface of the graphite lid 12 of the apparatus for growing a single crystal described above and placed in the graphite crucible 11 filled with the sublimation raw material 10, and the crucible was covered with a graphite felt 15. The seed crystal 1 was mounted on the graphite supporting rod 14 and installed inside the double quartz tube 13.

Then, after vacuum evacuating the inside of the double quartz tube 13, high purity Ar gas as an atmosphere gas was flown therein, and the pressure in the quartz tube was set to be 80 kPa. Under this pressure, a high frequency current is applied to a work coil 16 to increase the temperature of the seed crystal 1 up to 2200° C. Then, the pressure was reduced down to 1.3 kPa for 30 minutes, and 20-hour crystal growth was performed in which the crystal growth surface was the (000-1) plane of the seed crystal 1 [growth process (i)]. An estimate of the measurement results from another crystal growth performed under the same condition indicates that a SiC single crystal (initially grown layer 2) having a thickness of 6 mm was grown on the seed crystal by the 20-hour crystal growth (growth rate: 300 μm/h). In the crystal growth, an appropriate amount of nitrogen was introduced so as to have a nitrogen concentration of approximately $1 \times 10^{19}$ cm$^{-3}$ in the grown crystal, and the flow rate of nitrogen was maintained until the end of the crystal growth through all growth steps including the subsequent crystal growth.

After growing the SiC single crystal having the thickness of 6 mm in the manner as above, subsequently, pressure was reduced at a pressure changing rate of 1.3 kPa/h and a temperature was increased at a changing rate of 0° C./h for 4 hours to change the growth condition, and 20-hour crystal growth was performed keeping a growth atmosphere pressure of 6.5 kPa and a seed crystal temperature of 2200° C. (growth process (ii)). From an estimate of a result of separately performed crystal growth, as a result of the 20-hour crystal growth, a SiC single crystal having a thickness of 1.6 mm (structural conversion layer 3) is assumed to have grown (growth rate 80 μm/h).

Then, at a pressure changing rate of 1.3 kPa/h and a temperature changing rate 5° C./h, the growth condition was changed for 4 hours, the growth condition was changed for 4 hours, and 30-hour crystal growth was performed keeping growth atmosphere pressure at 1.3 kPa and seed crystal temperature at 2220° C. (growth process (iii)). From an estimate of a result of crystal growth separately performed in the same manner, as a result of the 30-hour crystal growth, a SiC single crystal having a thickness of 9 mm (main grown crystal 4) is assumed to have grown (growth rate 300 μm/h). Thus, a bulk SiC single crystal 5 (ingot) having a diameter of approximately 75 mm and a height of 16.6 mm was obtained.

In the bulk SiC single crystal 5 obtained above, a SiC single crystal was cut approximately perpendicularly to the crystal growth direction, by confirming the orientation with an X-ray crystal orientation measurement device, from a portion of the main grown crystal 4 grown in the growth process (iii), and subjected to mirror surface polishing to obtain a SiC single crystal substrate 8 having a thickness of 500 μm according to Example 1. This SiC single crystal substrate 8 had a main surface 9 (substrate surface) of which the off angle $\theta_w$ was 4°, and the off direction $d_w$ was the [11-20] direction.

The resultant SiC single crystal substrate 8 was immersed in a molten KOH at 520° C. for 5 minutes such that the entire surface of the substrate was immersed, so as to perform etching with the molten KOH. The main plane 9 of the substrate subjected to the etching was observed through an optical microscope (magnification: 80 times) to measure a screw dislocation density. Herein, in accordance with a method described in J. Takahashi et al., Journal of Crystal Growth, 135, (1994), 61-70, a shell-shaped pit was defined as a basal plane dislocation, a small-sized hexagonal pit was defined as a threading edge dislocation, and middle-sized and large-sized hexagonal pits were defined as screw dislocations to classify dislocation defects by etch-pit configurations and obtain a screw dislocation density. In addition, in the observation through the optical microscope, as explained in FIG. 5 above, the total 49 measurement points (the center point O, $a_1$ to $a_{24}$, $b_1$ to $b_{24}$) were selected. At that time, in each radius, a was set to a position of 0.5 at scale, b was set to a position of 0.9 at scale, and the number of screw dislocations in a region of 4 mm×3 mm around each measurement point as a center was measured to obtain a screw dislocation density at each measurement point.

Table 1 indicates the results.

TABLE 1

| Measurement points (unit:/cm$^2$) | | Example 1 | Example 2 |
|---|---|---|---|
| i) | Center point O | 1224 | 846 |
| ii) | $a_1$, $a_2$, $a_3$, $a_4$, $a_5$, $a_6$, $a_7$, $a_8$, $a_9$, $a_{10}$, $a_{11}$, $a_{12}$, $a_{13}$ | 1148, 1182, 1046, 1072, 766, 782, 744, 752, 956, 1082, 1012, 1256, 1174 | 788, 694, 548, 376, 394, 218, 286, 388, 214, 288, 846, 684, 798 |
| iii) | $b_1$, $b_2$, $b_3$, $b_4$, $b_5$, $b_6$, $b_7$, $b_8$, $b_9$, $b_{10}$, $b_{11}$, $b_{12}$, $b_{13}$ | 1132, 1016, 902, 784, 712, 854, 722, 788, 768, 698. 966, 904, 858 | 856, 796, 694, 442, 266, 244, 488, 482, 356, 484, 824, 784, 856 |
| iv) | $a_{14}$, $a_{15}$, $a_{16}$, $a_{17}$, $a_{18}$, $a_{19}$, $a_{20}$, $a_{21}$, $a_{22}$, $a_{23}$, $a_{24}$ | 1344, 1182, 1588, 1278, 1644, 1078, 1366, 1378, 1274, 1172, 1346 | 1034, 946, 1058, 1044, 844, 954, 842, 1068, 1074, 1018, 1236 |
| v) | $b_{14}$, $b_{15}$, $b_{16}$, $b_{17}$, $b_{18}$, $b_{19}$, $b_{20}$, $b_{21}$, $b_{22}$, $b_{23}$, $b_{24}$ | 1396, 1002, 1228, 1204, 1114, 1194, 1106, 1218, 1178, 1234, 1004 | 1046, 852, 862, 958, 758, 1324, 1024, 1026, 1058, 1268, 954 |
| vi) | $a_4$, $a_5$, $a_6$, $a_7$, $a_8$, $a_9$, $a_{10}$ | 1072, 766, 782, 744, 752, 956, 1082 | 376, 394, 218, 286, 388, 214, 288 |
| vii) | $b_4$, $b_5$, $b_6$, $b_7$, $b_8$, $b_9$, $b_{10}$ | 784, 712, 854, 722, 788, 768, 698 | 442, 266, 244, 488, 482, 356, 484, |
| average of total 27 measurement points of i) to iii) | | 937 | 553 |
| average of total 15 measurement points of i), vi), vii) | | 847 | 385 |
| average of total 22 measurement points of iv) to v) | | 1251 | 1011 |

As indicated in FIG. 2, when a diameter perpendicular to a virtual direction $V_w$ obtained by projecting the off direction $d_w$ of the SiC single crystal substrate 8 onto the main surface 9 was presented by a diameter $R_\perp$, and values measured at total 27 measurement points of i) to iii) included in the first semicircular region 8a on the side in the virtual direction $V_w$ with respect to the diameter $R_\perp$ as a boundary were averaged, the average value of the screw dislocation densities observed in the first semicircular region 8a was 937/cm$^2$. On the other hand, when values measured in 22 total measurement points of iv) to v) included in the second semicircular region 8b opposite to the virtual direction $V_w$ were averaged, the average value of screw dislocation densities observed in the second semicircular region 8b was 1251/cm$^2$. In other words, the average value of screw dislocation densities observed in a plurality of measurement points within the first semicircular region 8a was 74.9% of the average value of screw dislocation densities observed in a plurality of measurement points within the second semicircular region 8b. Moreover, values measured in 15 total measurement points of i), vi), and vii) included in the sectoral region 8a' were averaged, the average value of screw dislocation densities observed in the sectoral region 8a' was 847/cm², and 67.7% of the average value in the case of the second semicircular region 8b. When the first semicircular region 8a is defined without the measurement points of diameter $R_\perp$, the average value of screw dislocation densities observed in the first semicircular region 8a is 898/cm², and 71.8% of the average value of screw dislocation densities observed in a plurality of measurement points within the second semicircular region 8b.

In addition, in the bulk of the SiC single crystal remaining after cutting the SiC single crystal substrate 8, a (1-100) plane substrate was cut from the crystal including the seed crystal 1. The (1-100) plane substrate was immersed in a molten KOH at 520° C. for 5 minutes to perform etching with the molten KOH, and then the surface of the etched substrate was observed through an optical microscope (magnification: 100 times). As a result, in a portion corresponding to the structural conversion layer 3 of the growth process (ii), linear etching marks extending substantially perpendicularly to the growing direction were observed and the occurrence of a large number of stacking faults was found. In particular, the stacking faults concentrated in the region on the side of the off direction $d_s$ of the seed crystal 1.

Then, the region where the stacking faults occurred was observed by high resolution x-ray topography. In the observation, the (0004) plane was used as a diffraction plane. As a result, the X-ray topographic image showed defects extending in parallel to the growing direction of the SiC single crystal. From the relationship with the observation condition (transmission (0004)), the defects can be identified as crystal defects that include a screw dislocation component of which Burgers vector is <0001>. In other words, screw dislocations were confirmed to have been converted to the defects extending substantially perpendicularly to the growing direction. The points of occurrence of the defects match with the positions of stacking faults observed in the molten KOH etching, indicating that the SiC single crystal having the thickness of 1.6 mm corresponding to the structural conversion layer 3 of the growth process (ii) served as the structural conversion layer so that the screw dislocations were structurally converted to the stacking faults.

Example 2

First, a SiC single crystal substrate having a diameter of 75 mm was cut from a bulk SiC single crystal obtained in advance, subjected to mirror surface polishing to prepare a seed crystal 1 having an off angle of 4 degrees in a (0001) plane. The normal of the SiC seed crystal substrate has an off angle θs=4° with respect to the [0001] direction, and the off direction $d_s$ is the [11-20] direction. The seed crystal 1 was attached to the inner surface of the graphite lid 12 of the apparatus for growing a single crystal described above and placed in the graphite crucible 11 filled with the sublimation raw material 10, and the crucible was covered with a graphite felt 15, and then, the seed crystal 1 was mounted on the graphite supporting rod 14 and installed inside the double quartz tube 13.

Then, after vacuum evacuating the inside of the double quartz tube 13, high purity Ar gas as an atmosphere gas was flown therein, and the pressure in the quartz tube was set to be 80 kPa. Under this pressure, a high frequency current is applied to a work coil 16 to increase the temperature of the seed crystal 1 up to 2200° C. Then, the pressure was reduced down to 1.3 kPa, and 20-hour crystal growth was performed in which the crystal growth surface was the (000-1) plane of the seed crystal 1 [growth process (i)]. An estimate of the measurement results from another crystal growth performed under the same condition indicates that a SiC single crystal (initially grown layer 2) having a thickness of 6 mm was grown on the seed crystal by the 20-hour crystal growth (growth rate: 300 μm/h). In the crystal growth, an appropriate amount of nitrogen was introduced so as to have a nitrogen concentration of approximately $1\times10^{19}$ cm$^{-3}$ in the grown crystal. In addition, the flow rate of nitrogen was maintained until the end of the crystal growth through all growth steps including the subsequent crystal growth.

After growing the SiC single crystal having the thickness of 6 mm in the manner as above, subsequently, pressure was reduced at a pressure changing rate of 1.2 kPa/h and a temperature was increased at a changing rate of 0° C./h for 10 hours to change the growth condition, and 20-hour crystal growth was performed keeping a growth atmosphere pressure of 13.3 kPa and a seed crystal temperature of 2200° C. [growth process (ii)]. From an estimate of a result of separately performed crystal growth, as a result of the 20-hour crystal growth, a SiC single crystal having a thickness of 1 mm (structural conversion layer 3) is assumed to have grown (growth rate 50 μm/h).

Then, at a pressure changing rate of 1.2 kPa/h and a temperature changing rate 5° C./h, the growth condition was changed for 10 hours, and 30-hour crystal growth was performed keeping growth atmosphere pressure at 1.3 kPa and seed crystal temperature at 2250° C. [growth process (iii)]. From an estimate of a result of crystal growth separately performed in the same manner, as a result of the 30-hour crystal growth, a SiC single crystal having a thickness of 9 mm (main grown crystal 4) is assumed to have grown (growth rate 300 μm/h). Thus, a bulk SiC single crystal 5 (ingot) having a diameter of approximately 75 mm and a height of 16 mm was obtained.

In the bulk SiC single crystal obtained above, a SiC single crystal was cut from a portion of the main grown crystal 4 grown in the growth process (iii) near the center in the height direction in the same manner as Example 1, and subjected to mirror surface polishing to obtain a SiC single crystal substrate having a thickness of 500 μm according to Comparative example 1. This SiC single crystal substrate had a main surface (substrate surface) of which the off angle $\theta_w$ was 4°, and the off direction $d_w$ was the [11-20] direction.

The SiC single crystal substrate obtained above was subjected to molten KOH etching in the same manner as Example 1 and the (0001) plane of the etched substrate was observed through an optical microscope to obtain a screw dislocation density. Selection of measurement points and the measurement of the screw dislocation density were all performed in the same manner as Example 1.

Table 1 indicates the results.

As indicated in Table 1, when values measured at 27 total measurement points of i) to iii) included in the first semicircular region 8a were averaged, the average value of the screw dislocation densities observed in the first semicircular region 8a of the SiC single crystal substrate according to Example 2 was 553/cm². On the other hand, when values measured in 22 total measurement points of iv) to v) included in the second semicircular region 8b were averaged, the average value of screw dislocation densities observed in the second semicircular region 8b was 1011/cm², and the average value of screw dislocation densities observed in a plurality of measurement points within the first semicircular region 8a was 54.7% of the average value of screw dislocation densities observed in a plurality of measurement points within the second semicircular region 8b.

Moreover, values measured in 15 total measurement points of i), vi), and vii) included in the sectoral region 8a' were averaged, the average value of screw dislocation densities observed in the sectoral region 8a' was 385/cm², and 38.1% of the average value in the case of the second semicircular region 8b. When the first semicircular region 8a is defined without the measurement points of diameter $R_\perp$, the average value of screw dislocation densities observed in the first semicircular region 8a is 491/cm², and 48.6% of the average value of screw dislocation densities observed in a plurality of measurement points within the second semicircular region 8b.

Example 3

First, a SiC single crystal substrate having a diameter of 75 mm was cut from a bulk SiC single crystal obtained in advance, subjected to mirror surface polishing to prepare a seed crystal 1 having an off angle of 5 degrees in a (0001) plane. The normal of the SiC seed crystal substrate has an off angle θs=5° with respect to the [0001] direction, and the off direction $d_3$ is the [11-20] direction. The seed crystal 1 was attached to the inner surface of the graphite lid 12 of the apparatus for growing a single crystal described above and placed in the graphite crucible 11 filled with the sublimation raw material 10, and the crucible was covered with a graphite felt 15, and then, the seed crystal 1 was mounted on the graphite supporting rod 14 and installed inside the double quartz tube 13.

Then, after vacuum evacuating the inside of the double quartz tube 13, high purity Ar gas as an atmosphere gas was flown therein, and the pressure in the quartz tube was to be 80 kPa. Under this pressure, a high frequency current is applied to a work coil 16 to increase the temperature of the seed crystal 1 up to 2200° C. Then, the pressure was reduced down to 1.3 kPa, and 20-hour crystal growth was performed in which the crystal growth surface was the (000-1) plane of the seed crystal 1 [growth process (i)]. An estimate of the measurement results from another crystal growth performed under the same condition indicates that a SiC single crystal (initially grown layer 2) having a thickness of 6 mm was grown on the seed crystal by the 20-hour crystal growth (growth rate: 300 μm/h). In the crystal growth, an appropriate amount of nitrogen was introduced so as to have a nitrogen concentration of approximately $1\times10^{19}$ cm$^{-3}$ in the grown crystal. In addition, the flow rate of nitrogen was maintained until the end of the crystal growth through all growth steps including the subsequent crystal growth.

After growing the SiC single crystal having the thickness of 6 mm in the manner as above, subsequently, pressure was reduced at a pressure changing rate of 1.2 kPa/h and a temperature was increased at a changing rate of 0° C./h for 10 hours to change the growth condition, and 20-hour crystal growth was performed keeping a growth atmosphere pressure of 13.3 kPa and a seed crystal temperature of 2200° C. [growth process (ii)]. From an estimate of a result of separately performed crystal growth, as a result of the 20-hour crystal growth, a SiC single crystal having a thickness of 1 mm (structural conversion layer 3) is assumed to have grown (growth rate 50 μm/h).

Then, at a pressure changing rate of 1.2 kPa/h and a temperature changing rate 5° C./h, the growth condition was changed for 10 hours, and 30-hour crystal growth was performed keeping growth atmosphere pressure at 1.3 kPa and seed crystal temperature at 2250° C. [growth process (iii)]. From an estimate of a result of separately performed crystal growth, as a result of the 30-hour crystal growth, a SiC single crystal having a thickness of 9 mm (main grown crystal 4) is assumed to have grown (growth rate 300 μm/h). Thus, a bulk SiC single crystal 5 (ingot) having a diameter of approximately 75 mm and a height of 16 mm was obtained.

In the bulk SiC single crystal obtained above, a SiC single crystal was cut from a portion of the main grown crystal 4 grown in the growth process (iii) near the center in the height direction in the same manner as Example 3, and subjected to mirror surface polishing to obtain a SiC single crystal substrate having a thickness of 500 μm according to Comparative example 1. This SiC single crystal substrate had a main surface (substrate surface) of which the off angle $\theta_w$ was 5°, and the off direction $d_w$ was the [11-20] direction.

The SiC single crystal substrate obtained above was subjected to molten KOH etching in the same manner as Example 1 and the (0001) plane of the etched substrate was observed through an optical microscope to obtain a screw dislocation density. Selection of measurement points and the measurement of the screw dislocation density were all performed in the same manner as Example 1.

Table 1 indicates the results.

As indicated in Table 2, when values measured at 27 total measurement points of i) to iii) included in the first semicircular region 8a were averaged, the average value of the screw dislocation densities observed in the first semicircular region 8a of the SiC single crystal substrate according to Example 3 was 494/cm². On the other hand, values measured in 22 total measurement points of iv) to v) included in the second semicircular region 8b were 1001/cm², and the average value of screw dislocation densities observed in a plurality of measurement points within the first semicircular region 8a was 49.4% of the average value of screw dislocation densities observed in a plurality of measurement points within the second semicircular region 8b. Moreover, values measured in 15 total measurement points of i), vi), and vii) included in the sectoral region 8a' were averaged, the average value of screw dislocation densities observed in the sectoral region 8a' was 350/cm², and 35.0% of the average value in the case of the second semicircular region 8b. When the first semicircular region 8a is defined without the measurement points of diameter $R_\perp$, the average value of screw dislocation densities observed in the first semicircular region 8a is 426/cm², and 42.6% of the average value of screw dislocation densities observed in a plurality of measurement points within the second semicircular region 8b

TABLE 2

| Measurement points (unit:/cm²) | | Example 3 |
|---|---|---|
| i) | Center point O | 924 |
| ii) | $a_1, a_2, a_3, a_4,$ | 726, 688, 528, 456, |
| | $a_5, a_6, a_7, a_8,$ | 332, 260, 298, 236 |
| | $a_9, a_{10}, a_{11}, a_{12},$ | 382, 376, 562, 674, |
| | $a_{13}$ | 792 |
| iii) | $b_1, b_2, b_3, b_4,$ | 778, 682, 594, 266, |
| | $b_5, b_6, b_7, b_8,$ | 242, 398, 274, 226 |
| | $b_9, b_{10}, b_{11}, b_{12},$ | 284, 294, 622, 696, |
| | $b_{13}$ | 742 |
| iv) | $a_{14}, a_{15}, a_{16}, a_{17},$ | 968, 924, 1046, 1002, |
| | $a_{18}, a_{19}, a_{20}, a_{21},$ | 1132, 1032, 1082, 1016 |
| | $a_{22}, a_{23}, a_{24}$ | 1282, 1074, 832 |
| v) | $b_{14}, b_{15}, b_{16}, b_{17},$ | 846, 976, 922, 1048, |
| | $b_{18}, b_{19}, b_{20}, b_{21},$ | 1062, 1024, 1066, 1096, |
| | $b_{22}, b_{23}, b_{24}$ | 868, 864, 852 |
| vi) | $a_4, a_5, a_6, a_7,$ | 456, 332, 260, 298, |
| | $a_8, a_9, a_{10}$ | 236, 382, 376 |

TABLE 2-continued

| Measurement points (unit:/cm$^2$) | Example 3 |
|---|---|
| vii) $b_4, b_5, b_6, b_7,$ $b_8, b_9, b_{10}$ | 266, 242, 398, 274, 226, 284, 294 |
| average of total 27 measurement points of i) to iii) | 494 |
| average of total 15 measurement points of i), vi), vii) | 350 |
| average of total 22 measurement points of iv) to v) | 1001 |

Example 4

First, a SiC single crystal substrate having a diameter of 75 mm was cut from a bulk SiC single crystal obtained in advance, subjected to mirror surface polishing to prepare a seed crystal 1 having an off angle of 8 degrees in a (0001) plane. The normal of the SiC seed crystal substrate has an off angle θs=8° with respect to the [0001] direction, and the off direction $d_s$ is the [11-20] direction. The seed crystal 1 was attached to the inner surface of the graphite lid 12 of the apparatus for growing a single crystal described above and placed in the graphite crucible 11 filled with the sublimation raw material 10, and the crucible was covered with graphite felt 15, and then, the seed crystal 1 was mounted on the graphite supporting rod 14 and installed inside the double quartz tube 13.

Then, after vacuum evacuating the inside of the double quartz tube 13, high purity Ar gas as an atmosphere gas was flown therein, and the pressure in the quartz tube was to be 80 kPa. Under this pressure, a high frequency current is applied to a work coil 16 to increase the temperature of the seed crystal 1 up to 2200° C. Then, the pressure was reduced down to 1.3 kPa, and 20-hour crystal growth was performed in which the crystal growth surface was the (000-1) plane of the seed crystal 1 [growth process (i)]. An estimate of the measurement results from another crystal growth performed under the same condition indicates that a SiC single crystal having a thickness of 6 mm (initially grown layer 2) was grown on the seed crystal by the 20-hour crystal growth (growth rate: 300 μm/h). In the crystal growth, an appropriate amount of nitrogen was introduced so as to have a nitrogen concentration of approximately $1 \times 10^{19}$ cm$^{-3}$ in the grown crystal. In addition, the flow rate of nitrogen was maintained until the end of the crystal growth through all growth steps including the subsequent crystal growth.

After growing the SiC single crystal having the thickness of 6 mm in the manner as above, subsequently, pressure was reduced at a pressure changing rate of 1.265 kPa/h and a temperature was increased at a changing rate of 0° C./h for 20 hours to change the growth condition, and 40-hour crystal growth was performed keeping a growth atmosphere pressure of 26.6 kPa and a seed crystal temperature of 2200° C. [growth process (ii)]. From an estimate of a result of a separately performed crystal growth, as a result of the 40-hour crystal growth, a SiC single crystal having a thickness of 1 mm (structural conversion layer 3) is assumed to have grown (growth rate 25 μm/h).

Then, at a pressure changing rate of 1.265 kPa/h and a temperature changing rate 2° C./h, the growth condition was changed for 30 hours, and 30-hour crystal growth was performed keeping growth atmosphere pressure at 1.3 kPa and seed crystal temperature at 2260° C. (growth process (iii)). From an estimate of a result of separately performed crystal growth, as a result of the 30-hour crystal growth, a SiC single crystal having a thickness of 9 mm (main grown crystal 4) is assumed to have grown (growth rate 300 μm/h). Thus, a bulk SiC single crystal 5 (ingot) having a diameter of approximately 75 mm in and a height of 16 mm was obtained.

In the bulk SiC single crystal obtained above, a SiC single crystal was cut from a portion of the main grown crystal 4 grown in the growth process (iii) near the center in the height direction in the same manner as Example 1, and subjected to mirror surface polishing to obtain a SiC single crystal substrate having a thickness of 500 μm according to Example 4. This SiC single crystal substrate had a main surface (substrate surface) of which the off angle $θ_w$ was 8°, and the off direction $d_w$ was the [11-20] direction.

The SiC single crystal substrate obtained above was subjected to molten KOH etching in the same manner as Example 1 and the (0001) plane of the etched substrate was observed through an optical microscope to obtain a screw dislocation density. Selection of measurement points and the measurement of the screw dislocation density were all performed in the same manner as Example 1.

Table 3 indicates the results.

TABLE 3

| Measurement points (unit:/cm$^2$) | | Example 4 | Comparative example 1 |
|---|---|---|---|
| i) | Center point O | 618 | 1028 |
| ii) | $a_1, a_2, a_3, a_4,$ $a_5, a_6, a_7, a_8,$ $a_9, a_{10}, a_{11}, a_{12},$ $a_{13}$ | 566, 558, 448, 254, 176, 148, 206, 144, 224, 256, 584, 522, 592 | 1296, 1120, 952, 1084, 980, 868, 1020, 912, 1044, 1068, 920, 944, 1022 |
| iii) | $b_1, b_2, b_3, b_4,$ $b_5, b_6, b_7, b_8,$ $b_9, b_{10}, b_{11}, b_{12},$ $b_{13}$ | 632, 598, 478, 248, 178, 204, 168, 216, 248, 218, 388, 628, 552 | 1092, 1028, 936, 992, 884, 792, 784, 900, 932, 976, 1052, 900, 1036 |
| iv) | $a_{14}, a_{15}, a_{16}, a_{17},$ $a_{18}, a_{19}, a_{20}, a_{21},$ $a_{22}, a_{23}, a_{24}$ | 884, 852, 758, 1046, 958, 862, 844, 852, 954, 866, 946 | 1084, 1252, 958, 1046, 1158, 962, 1044, 1052, 1154, 1066, 1146 |
| v) | $b_{14}, b_{15}, b_{16}, b_{17},$ $b_{18}, b_{19}, b_{20}, b_{21},$ $b_{22}, b_{23}, b_{24}$ | 946, 752, 844, 764, 862, 654, 696, 842, 684, 980, 622 | 924, 860, 868, 908, 808, 900, 952, 908, 1008, 1128, 1244 |
| vi) | $a_4, a_5, a_6, a_7,$ $a_8, a_9, a_{10}$ | 254, 176, 148, 206, 144, 224, 256 | 1084, 980, 868, 1020, 912, 1044, 1068 |
| vii) | $b_4, b_5, b_6, b_7,$ $b_8, b_9, b_{10}$ | 248, 178, 204, 168, 216, 248, 218 | 992, 884, 792, 784, 900, 932, 976 |
| average of total 27 measurement points of i) to iii) | | 372 | 984 |
| average of total 15 measurement points of i), vi), vii) | | 234 | 951 |
| average of total 22 measurement points of iv) to v) | | 839 | 1020 |

As indicated in Table 3, when values measured at 27 total measurement points of i) to iii) included in the first semicircular region 8a were averaged, the average value of the screw dislocation densities observed in the first semicircular region 8a of the SiC single crystal substrate according to Example 3 was 372/cm$^2$. On the other hand, when values measured in 22 total measurement points of iv) to v) included in the second semicircular region 8b were averaged, the average value of screw dislocation densities observed in the second semicircular region 8b was 839/cm$^2$, and the average value of screw dislocation densities observed in a plurality of measurement points within the first semicircular region 8a was 44.3% of the average value of screw dislocation densities observed in a plurality of measurement points within the second semicircular region 8b. Moreover, values measured in 15 total measurement points of i), vi), and vii) included in the sectoral region 8a' were averaged, the average value of screw dislocation densities observed in the sectoral region 8a' was 234/cm$^2$, and 27.9% of the average value in the case of the second semicircular region 8b. When the first semicircular region 8a is defined without the measurement points of diameter R$_\perp$, the average value of screw dislocation densities observed in the first semicircular region 8a is 322/cm$^2$, and 38.4% of the average value of screw dislocation densities observed in a plurality of measurement points within the second semicircular region 8b.

Comparative Example 1

First, a SiC single crystal substrate having a diameter of 75 mm was cut from a bulk SiC single crystal obtained in advance, subjected to mirror surface polishing to prepare a seed crystal 1 having an off angle of 4 degrees in a (0001) plane. The normal of the SiC seed crystal substrate has an off angle θs=4° with respect to the [0001] direction, and the off direction d$_s$ is the [11-20] direction. The seed crystal 1 was attached to the inner surface of the graphite lid 12 of the apparatus for growing a single crystal described above and placed in the graphite crucible 11 filled with the sublimation raw material 10, and the crucible was covered with a graphite felt 15, and then, the seed crystal 1 was mounted on the graphite supporting rod 14 and installed inside the double quartz tube 13.

Then, after vacuum evacuating the inside of the double quartz tube 13, high purity Ar gas as an atmosphere gas was flown therein, and the pressure in the quartz tube was to be 80 kPa. Under this pressure, a high frequency current is applied to a work coil 16 to increase the temperature of the seed crystal 1 up to 2200° C. Then, the pressure was reduced down to 1.3 kPa, and 60-hour crystal growth in which the crystal growth surface was the (000-1) plane of the seed crystal 1 was performed to obtain a bulk SiC single crystal having a diameter of approximately 75 mm and a height of 18 mm (growth rate: 300 μm/h). In the crystal growth, an appropriate amount of nitrogen was introduced so as to have a nitrogen concentration of approximately 1×10$^{19}$ cm$^{-3}$ in the grown crystal.

In the bulk SiC single crystal obtained above, a SiC single crystal was cut from near the center in the height direction in the same manner as Example 1, and subjected to mirror surface polishing to obtain a SiC single crystal substrate having a thickness of 500 μm according to Comparative example 1. This SiC single crystal substrate had a main surface (substrate surface) of which the off angle θ$_w$ was 4°, and the off direction d$_w$ was the [11-20] direction.

The SiC single crystal substrate obtained above was subjected to molten KOH etching in the same manner as Example 1 and the (0001) plane of the etched substrate was observed through an optical microscope to obtain a screw dislocation density. Selection of measurement points and the measurement of the screw dislocation density were all performed in the same manner as Example 1.

Table 3 indicates the results.

As indicated in Table 3, when values measured at 27 total measurement points of i) to iii) included in the first semicircular region 8a were averaged, the average value of the screw dislocation densities observed in the first semicircular region 8a of the SiC single crystal substrate according to Comparative example 1 was 984/cm$^2$. On the other hand, values measured in 22 total measurement points of iv) to v) included in the second semicircular region 8b were 1020/cm$^2$, and the value for the first semicircular region 8a was comparable to that for the second semicircular region 8b (the average value of the screw dislocation density observed in the first semicircular region was 96.5% of that in the second semicircular region). Moreover, the average of values measured in 15 total measurement points of i), vi), and vii) included in the sectoral region 8a' of the SiC single crystal substrate according to the Comparative example 1 was 951/cm$^2$, and was also comparable. When the first semicircular region 8a is defined without the measurement points of diameter R$_\perp$, the average value of screw dislocation densities observed in the first semicircular region 8a is 959/cm$^2$, and 94.0% of the average value of screw dislocation densities observed in a plurality of measurement points within the second semicircular region 8b.

Then, in the bulk of the SiC single crystal remaining after cutting the SiC single crystal substrate of Comparative example 1, a (1-100) plane substrate was cut from the crystal including the seed crystal. The substrate was subjected to molten KOH etching in the same manner as Example 1, and the surface of the etched substrate was observed through an optical microscope. As a result, no stacking faults as observed in Example 1 were particularly found and thus the structural conversion of screw dislocations was not observed.

LIST OF REFERENCE SIGN

1: seed crystal
2: initially grown layer
3: structural conversion layer
4: main grown crystal
5: bulk SiC single crystal
6: screw dislocation
7: stacking fault
8: SiC single crystal substrate
8a: first semicircular region
8a': sectoral region
8b: the second semicircular region
9: main surface of SiC single crystal substrate
10: SiC sublimation raw material
11: graphite crucible
12: graphite lid
13: double quartz tube
14: graphite supporting rod
15: graphite felt
16: work coil
17: pipe
18: mass flow controller
19: vacuum pumping device

The invention claimed is:
1. A method for manufacturing a silicon carbide single crystal by a physical vapor transport method using a seed crystal, the method being characterized by including:
(i) a first growth step of growing a silicon carbide single crystal having a thickness of at least 1 mm at a first growth atmosphere pressure of not lower than 0.13 kPa and not higher than 2.6 kPa and a first growth temperature in which the temperature of the seed crystal is not lower than 2100° C. and not higher than 2400° C.;
(ii) a second growth step of growing the silicon carbide single crystal having a thickness of at least 0.5 mm at a second growth atmosphere pressure of higher than 2.6 kPa and not higher than 65 kPa and a second growth temperature in which the temperature of the seed crystal is not lower than 2100° C. and not higher than 2400° C.; and (iii) a third growth step of growing the silicon carbide single crystal to a larger thickness than in the first growth step at a third growth atmosphere pressure of not lower than 0.13 kPa and not higher than 2.6 kPa and a third growth temperature in which the temperature of the seed crystal is not lower than 2100° C. and not higher than 2400° C.;

wherein the seed crystal is composed of SiC single crystal and has an off angle $\theta_s$ of more than 0° and not more than 16° relative to (0001) plane, wherein a constant growth temperature is maintained throughout the steps (i) to (iii).

2. The method for manufacturing a silicon carbide single crystal according to claim 1, wherein the first and the second growth atmosphere pressures are changed to the second and the third growth atmosphere pressures, respectively, at a pressure changing rate of 13.3 kPa or less per hour.

3. The method for manufacturing a silicon carbide single crystal according to claim 1, wherein crystal growth rate in the second growth step is 100 μm/hr or less.

4. A method for manufacturing a silicon carbide single crystal by a physical vapor transport method using a seed crystal, the method being characterized by including:

(i) a first growth step of growing a silicon carbide single crystal having a thickness of at least 1 mm at a first growth atmosphere pressure of not lower than 0.13 kPa and not higher than 2.6 kPa and a first growth temperature in which the temperature of the seed crystal is not lower than 2100° C. and not higher than 2400° C.;

(ii) a second growth step of growing the silicon carbide single crystal having a thickness of at least 0.5 mm at a second growth atmosphere pressure of higher than 2.6 kPa and not higher than 65 kPa and a second growth temperature in which the temperature of the seed crystal is not lower than 2100° C. and not higher than 2400° C.; and (iii) a third growth step of growing the silicon carbide single crystal to a larger thickness than in the first growth step at a third growth atmosphere pressure of not lower than 0.13 kPa and not higher than 2.6 kPa and a third growth temperature in which the temperature of the seed crystal is not lower than 2100° C. and not higher than 2400° C.;

wherein the seed crystal is composed of SiC single crystal and has an off angle $\theta_s$ of more than 4° and not more than 16° relative to (0001) plane, wherein a constant growth temperature is maintained throughout the steps (i) to (iii).

* * * * *